United States Patent
Tsou

(10) Patent No.: US 8,049,706 B2
(45) Date of Patent: Nov. 1, 2011

(54) GATE DRIVING CIRCUIT CAPABLE OF SUPPRESSING THRESHOLD VOLTAGE DRIFT

(75) Inventor: Yuan-Hsin Tsou, Kaohsiung County (TW)

(73) Assignee: Chunghwa Picture Tubes, Ltd., Bade, Taoyuan (TW)

( * ) Notice: Subject to any disclaimer, the term of this patent is extended or adjusted under 35 U.S.C. 154(b) by 451 days.

(21) Appl. No.: 12/413,595

(22) Filed: Mar. 29, 2009

(65) Prior Publication Data
US 2010/0182227 A1    Jul. 22, 2010

(30) Foreign Application Priority Data
Jan. 16, 2009    (TW) ................................ 98101496 A

(51) Int. Cl.
*G09G 3/36*    (2006.01)

(52) U.S. Cl. ......................................... 345/100; 345/87

(58) Field of Classification Search ............ 345/87–100, 345/204
See application file for complete search history.

(56) References Cited

U.S. PATENT DOCUMENTS

| | | | |
|---|---|---|---|
| 6,300,928 B1 * | 10/2001 | Kim ................................ | 345/92 |
| 6,690,347 B2 * | 2/2004 | Jeon et al. ...................... | 345/100 |
| 6,845,140 B2 * | 1/2005 | Moon et al. ..................... | 377/78 |
| 2008/0088555 A1 * | 4/2008 | Shin et al. ........................ | 345/87 |
| 2008/0100560 A1 * | 5/2008 | Na et al. .......................... | 345/101 |
| 2008/0122829 A1 * | 5/2008 | Park ............................. | 345/213 |
| 2009/0040203 A1 * | 2/2009 | Kim et al. ...................... | 345/204 |
| 2009/0189677 A1 * | 7/2009 | Lee et al. ....................... | 327/427 |
| 2010/0188385 A1 * | 7/2010 | Boiko ............................ | 345/211 |
| 2011/0169874 A1 * | 7/2011 | Jang et al. ...................... | 345/690 |

* cited by examiner

*Primary Examiner* — Nitin Patel
(74) *Attorney, Agent, or Firm* — Winston Hsu; Scott Margo

(57) ABSTRACT

A gate driving circuit capable of suppressing threshold voltage drift is disclosed for providing gate signals forwarded to gate lines. The gate driving circuit includes a plurality of shift register stages. Each shift register stage includes a pull-up unit, an energy-store unit, a buffer unit, a discharging unit, a pull-down unit, a control unit and a signal switching unit. The pull-up unit pulls up a gate signal according to a driving control voltage and a first clock. The energy-store unit provides the driving control voltage through performing a charging process based on an input signal received by the buffer unit. The pull-down unit pulls down the gate signal according to a control signal. The control unit generates the control signal based on the input signal and a second clock having a phase opposite to the first clock. The signal switching unit switches the control signal according to the first clock.

35 Claims, 9 Drawing Sheets

GATE DRIVING CIRCUIT CAPABLE OF SUPPRESSING THRESHOLD VOLTAGE DRIFT

BACKGROUND OF THE INVENTION

1. Field of the Invention

The present invention relates to a gate driving circuit, and more particularly, to a gate driving circuit capable of suppressing threshold voltage drift.

2. Description of the Prior Art

Because the liquid crystal display (LCD) has advantages of thin appearance, low power consumption, and low radiation, the liquid crystal display has been widely applied in various electronic products for panel displaying. The operation of a liquid crystal display is featured by varying voltage drops between opposite sides of a liquid crystal layer for twisting the angles of the liquid crystal molecules in the liquid crystal layer so that the transmittance of the liquid crystal layer can be controlled for illustrating images with the aid of the light source provided by a backlight module.

In general, the liquid crystal display comprises a plurality of pixel units, a gate driving circuit, and a source driving circuit. The source driving circuit is utilized for providing a plurality of data signals to be written into the pixel units. The gate driving circuit comprises a plurality of shift register stages and functions to provide a plurality of gate driving signals for controlling related writing operations of the pixel units. That is, the gate driving circuit is a crucial device for providing a control of writing the data signals into the pixel units.

FIG. 1 is a schematic diagram showing a prior-art gate driving circuit. As shown in FIG. 1, for ease of explanation, the gate driving circuit 100 illustrates only a (N−1)th shift register stage 111, an Nth shift register stage 112, and a (N+1)th shift register stage 113. For sake of brevity, only the internal structure of the Nth shift register stage 112 is exemplified. The Nth shift register stage 112 is employed to generate a gate signal SGn according to a first clock CK1, a second clock CK2, and a gate signal SGn−1. The gate signal SGn is furnished to a corresponding pixel unit of a pixel array 101 via a gate line GLn so as to control a writing operation for writing the data signal of the data line DLi into the pixel unit. Furthermore, the gate signal SGn is forwarded to the (N+1)th shift register stage 113 and functions as a start pulse signal for activating the (N+1)th shift register stage 113. The Nth shift register stage 112 comprises a pull-up unit 120, an energy-store unit 135, a buffer unit 140, a pull-down unit 150, a discharging unit 155, and a control unit 160.

The energy store unit 135 is used to generate a driving control voltage VQn through performing a charging process based on the gate signal SGn−1 received by the buffer unit 140. The pull-up unit 120 is utilized for pulling up the gate signal SGn of the gate line GLn according to the driving control voltage VQn and the first clock CK1. The control unit 160 comprises a plurality of transistors for generating a control signal SCn based on the gate signal SGn−1 and the second clock CK2 having a phase opposite to the first clock CK1. The discharging unit 155 is utilized for pulling down the driving control voltage VQn to a low power voltage Vss by performing a discharging process on the energy-store unit 135 according to the control signal SCn. The pull-down unit 150 is employed to pull down the gate signal SGn to the low power voltage Vss based on the control signal SCn.

However, in the operation of the gate driving circuit 100, except for the interval during which the Nth shift register stage 112 is activated for generating the gate signal SGn having high voltage level, the control signal SCn holds high voltage level for enabling the pull-down unit 150 and the discharging unit 155. That is, the transistors 151, 156 of the pull-down unit 150 and the discharging unit 155 maintain turn-on state in most of operating time, which is likely to incur an occurrence of threshold voltage drift and degrades the reliability and life-time of the gate driving circuit 100.

SUMMARY OF THE INVENTION

In accordance with an embodiment of the present invention, a gate driving circuit capable of suppressing threshold voltage drift is provided. The gate driving circuit is utilized for providing a plurality of gate signals to a plurality of gate lines. The gate driving circuit comprises a plurality of shift register stages. An Nth shift register stage of the shift register stages comprises a pull-up unit, a buffer unit, an energy-store unit, a discharging unit, a pull-down unit, a control unit, and a signal switching unit.

The pull-up unit is electrically connected to an Nth gate line of the gate lines and functions to pull up an Nth gate signal of the gate signals to a high voltage level according to a driving control voltage and a first clock. The buffer unit is employed to receive an input signal. The energy-store unit is electrically connected to the pull-up unit and the buffer unit. The energy-store unit is utilized for providing the driving control voltage to the pull-up unit through performing a charging process based on the input signal. The discharging unit is electrically connected to the energy-store unit for pulling down the driving control voltage to a low power voltage according to a control signal or a (N+1)th gate signal generated by a (N+1)th shift register stage of the shift register stages. The pull-down unit is electrically connected to the Nth gate line for pulling down the Nth gate signal to the low power voltage according to the control signal. The control unit is electrically connected to the discharging unit and the pull-down unit and functions to generate the control signal based on the input signal and a second clock having a phase opposite to the first clock. The signal switching unit is electrically connected to the control unit and is utilized for switching the control signal to the low power voltage according to the first clock.

In accordance with another embodiment of the present invention, a gate driving circuit capable of suppressing threshold voltage drift is provided. The gate driving circuit is utilized for providing a plurality of gate signals to a plurality of gate lines. The gate driving circuit comprises a plurality of shift register stages. An Nth shift register stage of the shift register stages comprises a pull-up unit, a buffer unit, an energy-store unit, a discharging unit, a pull-down unit, a control unit, and a signal switching unit.

The pull-up unit is electrically connected to an Nth gate line of the gate lines and functions to pull up an Nth gate signal of the gate signals to a high voltage level according to a driving control voltage and a first clock. The buffer unit is employed to receive an input signal. The energy-store unit is electrically connected to the pull-up unit and the buffer unit. The energy-store unit is utilized for providing the driving control voltage to the pull-up unit through performing a charging process based on the input signal. The discharging unit is electrically connected to the energy-store unit for pulling down the driving control voltage to a low power voltage according to a (N+1)th gate signal generated by a (N+1)th shift register stage of the shift register stages. The pull-down unit is electrically connected to the Nth gate line for pulling down the Nth gate signal to the low power voltage according to the control signal. The control unit is electrically connected to the pull-down unit and functions to generate the control signal based on the first clock and the Nth gate signal. The signal switching unit is electrically connected to the control unit and is utilized for switching the control signal to the low power voltage according to a second clock having a phase opposite to the first clock.

These and other objectives of the present invention will no doubt become obvious to those of ordinary skill in the art after reading the following detailed description of the preferred embodiment that is illustrated in the various figures and drawings.

DETAILED DESCRIPTION

Hereinafter, preferred embodiments of the present invention will be described in detail with reference to the accompanying drawings. Here, it is to be noted that the present invention is not limited thereto.

Figure 1:
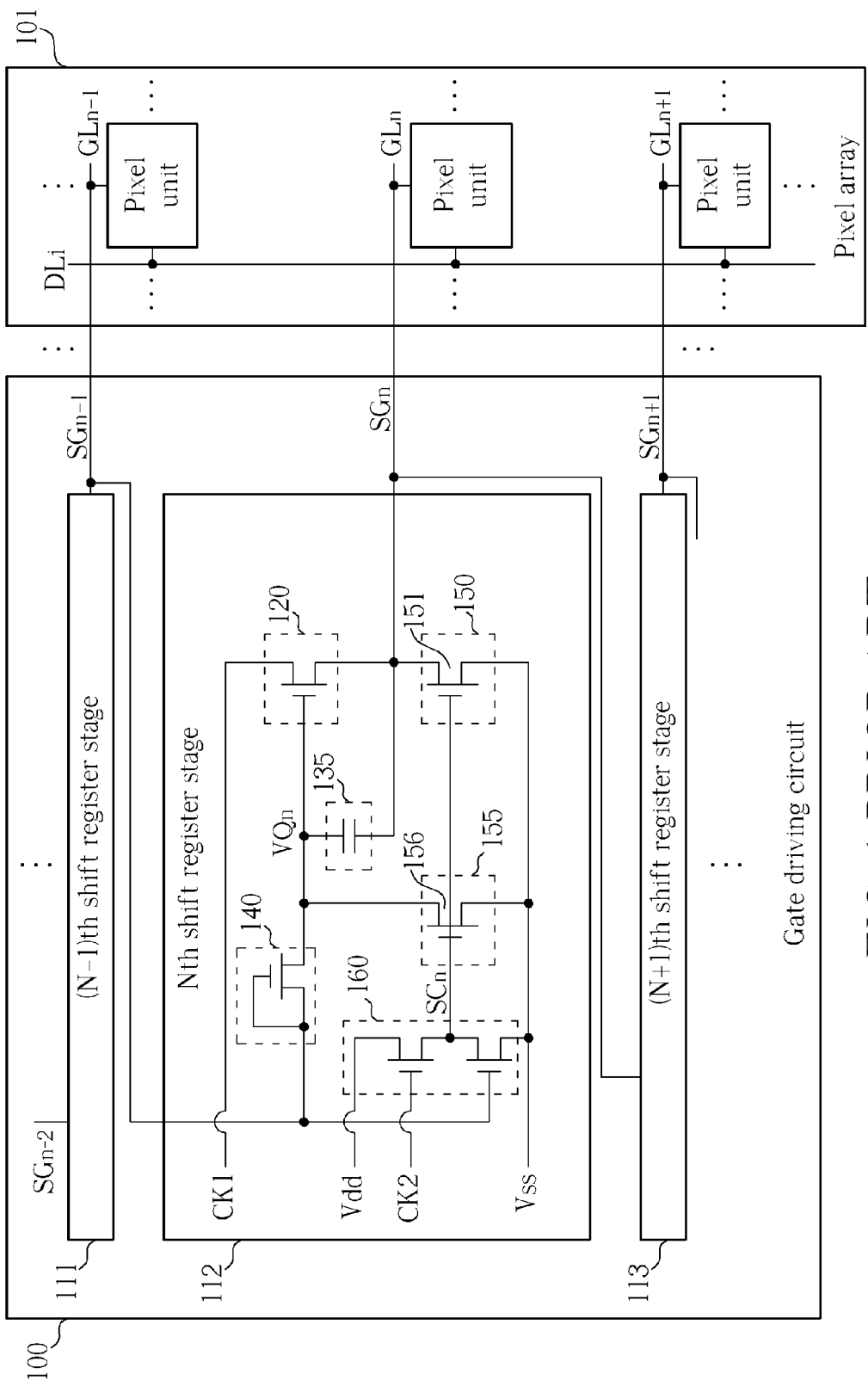
FIG. 1 is a schematic diagram showing a prior-art gate driving circuit.
Figure 2:
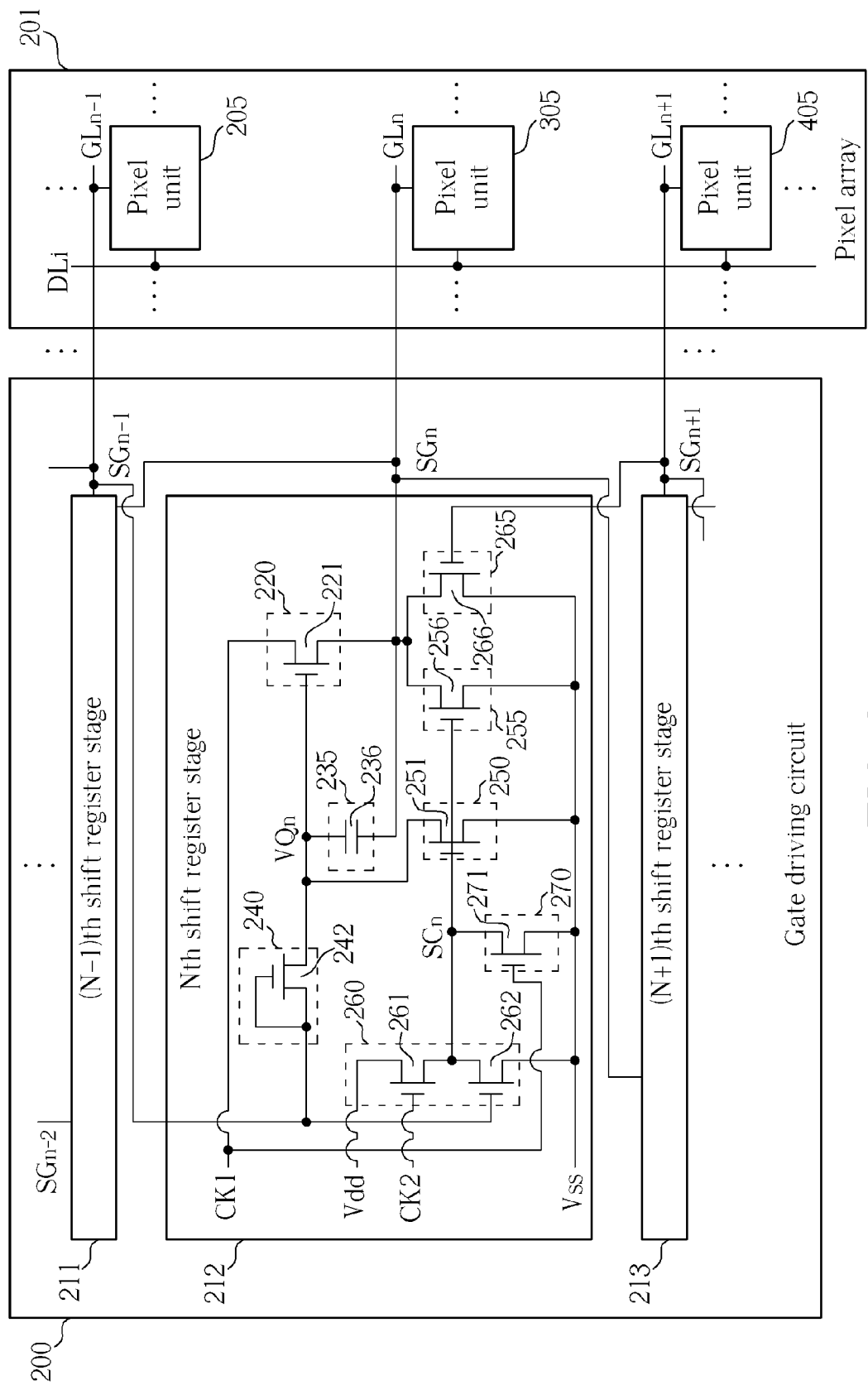
FIG. 2 is a schematic diagram showing a gate driving circuit in accordance with a first embodiment of the present invention.

FIG. 2 is a schematic diagram showing a gate driving circuit in accordance with a first embodiment of the present invention As shown in FIG. 2, the gate driving circuit 200 comprises a plurality of shift register stages and, for ease of explanation, illustrates only a (N−1)th shift register stage 211, an Nth shift register stage 212, and a (N+1)th shift register stage 213. For sake of brevity, only the internal structure of the Nth shift register stage 212 is exemplified. The other shift register stages are similar to the Nth shift register stage 212 and can be inferred by analogy. The (N−1)th shift register stage 211 is employed to provide a gate signal SGn−1, the Nth shift register stage 212 is employed to provide a gate signal SGn, and the (N+1)th shift register stage 213 is employed to provide a gate signal SGn+1. The gate signal SGn−1 is furnished to a pixel unit 205 of a pixel array 201 via a gate line GLn−1 so as to control a writing operation of the pixel unit 205 for writing a corresponding data signal of the data line DLi into the pixel unit 205. The gate signal SGn is furnished to a pixel unit 305 of the pixel array 201 via a gate line GLn so as to control a writing operation of the pixel unit 305 for writing a corresponding data signal of the data line DLi into the pixel unit 305. The gate signal SGn+1 is furnished to a pixel unit 405 of the pixel array 201 via a gate line GLn+1 so as to control a writing operation of the pixel unit 405 for writing a corresponding data signal of the data line DLi into the pixel unit 405.

The Nth shift register stage 212 comprises a pull-up unit 220, an energy-store unit 235, a buffer unit 240, a discharging unit 250, a pull-down unit 255, a control unit 260, an auxiliary pull-down unit 265, and a signal switching unit 270. The pull-up unit 220 is electrically connected to the gate line GLn and functions to pull up the gate signal SGn of the gate line GLn based on the driving control voltage VQn and the first clock CK1. The buffer unit 240 is electrically connected to the (N−1)th shift register stage 211 for receiving the gate signal SGn−1. That is, the gate signal SGn−1 is also used as a start pulse signal for activating the Nth shift register stage 212. The energy-store unit 235 is electrically connected to the pull-up unit 220 and the buffer unit 240 and functions to provide the driving control voltage VQn to the pull-up unit 220 through performing a charging process based on the gate signal SGn−1. The control unit 260 is electrically connected to the discharging unit 250 and the pull-down unit 255 for providing a control signal SCn based on the gate signal SGn−1 and a second clock CK2 having a phase opposite to the first clock CK1. The discharging unit 250 is electrically connected to the energy-store unit 235 for pulling down the driving control voltage VQn to a low power voltage Vss by performing a discharging process based on the control signal SCn. The pull-down unit 255 is electrically connected to the gate line GLn for pulling down the gate signal SGn to the low power voltage Vss according to the control signal SCn. Besides, the auxiliary pull-down unit 265 is also electrically connected to the gate line GLn for pulling down the gate signal SGn to the low power voltage Vss according to the gate signal SGn+1. The signal switching unit 270 is electrically connected to the control unit 260 and functions to switch the control signal SCn to the low power voltage Vss according to the first clock CK1.

In the embodiment shown in FIG. 2, the buffer unit 240 comprises a buffer transistor 242, the pull-up unit 220 comprises a first switch 221, the energy-store unit 235 comprises a capacitor 236, the discharging unit 250 comprises a second switch 251, the pull-down unit 255 comprises a third switch 256, the auxiliary pull-down unit 265 comprises a fourth switch 266, the control unit 260 comprises a fifth transistor 261 and a sixth transistor 262, and the signal switching unit 270 comprises a seventh switch 271. The buffer transistor 242 comprises a first terminal electrically connected to the (N−1) th shift register stage 211 for receiving the gate signal SGn−1, a gate terminal electrically connected to the first terminal, and a second terminal electrically connected to the capacitor 236. The first switch 221 comprises a first terminal for receiving the first clock CK1, a gate terminal electrically connected to the second terminal of the buffer transistor 242, and a second terminal electrically connected to the gate line GLn. The capacitor 236 comprises a first terminal electrically connected to the gate terminal of the first switch 221 and a second terminal electrically connected to the second terminal of the first switch 221.

The second switch 251 comprises a first terminal electrically connected to the first terminal of the capacitor 236, a second terminal for receiving the low power voltage Vss, and a gate terminal electrically connected to the control unit 260 for receiving the control signal SCn. The third switch 256 comprises a first terminal electrically connected to the second terminal of first switch 221, a second terminal for receiving the low power voltage Vss, and a gate terminal electrically connected to the control unit 260 for receiving the control signal SCn. The fourth switch 266 comprises a first terminal electrically connected to the second terminal of the first switch 221, a second terminal for receiving the low power voltage Vss, and a gate terminal for receiving the gate signal SGn+1. The fifth switch 261 comprises a first terminal for receiving a high power voltage Vdd, a second terminal electrically connected to the gate terminals of the second switch 251 and the third switch 256, and a gate terminal for receiving the second clock CK2. The fifth switch 261 is employed to pull up the control signal SCn to the high power voltage Vdd according to the second clock CK2. The sixth switch 262 comprises a first terminal electrically connected to the second terminal of the fifth transistor 261, a second terminal for receiving the low power voltage Vss, and a gate terminal for receiving the gate signal SGn−1. The sixth switch 262 is employed to pull down the control signal SCn to the low power voltage Vss according to the gate signal SGn−1. The seventh switch 271 comprises a first terminal electrically connected to the second terminal of the fifth switch 261, a second terminal for receiving the low power voltage Vss, and a gate terminal for receiving the first clock CK1. The seventh switch 271 is employed to switch the control signal SCn to the low power voltage Vss according to the first clock CK1. The first switch 221 through the seventh switch 271 are thin film transistors, metal oxide semiconductor (MOS) field effect transistors, or junction field effect transistors.

Figure 3:
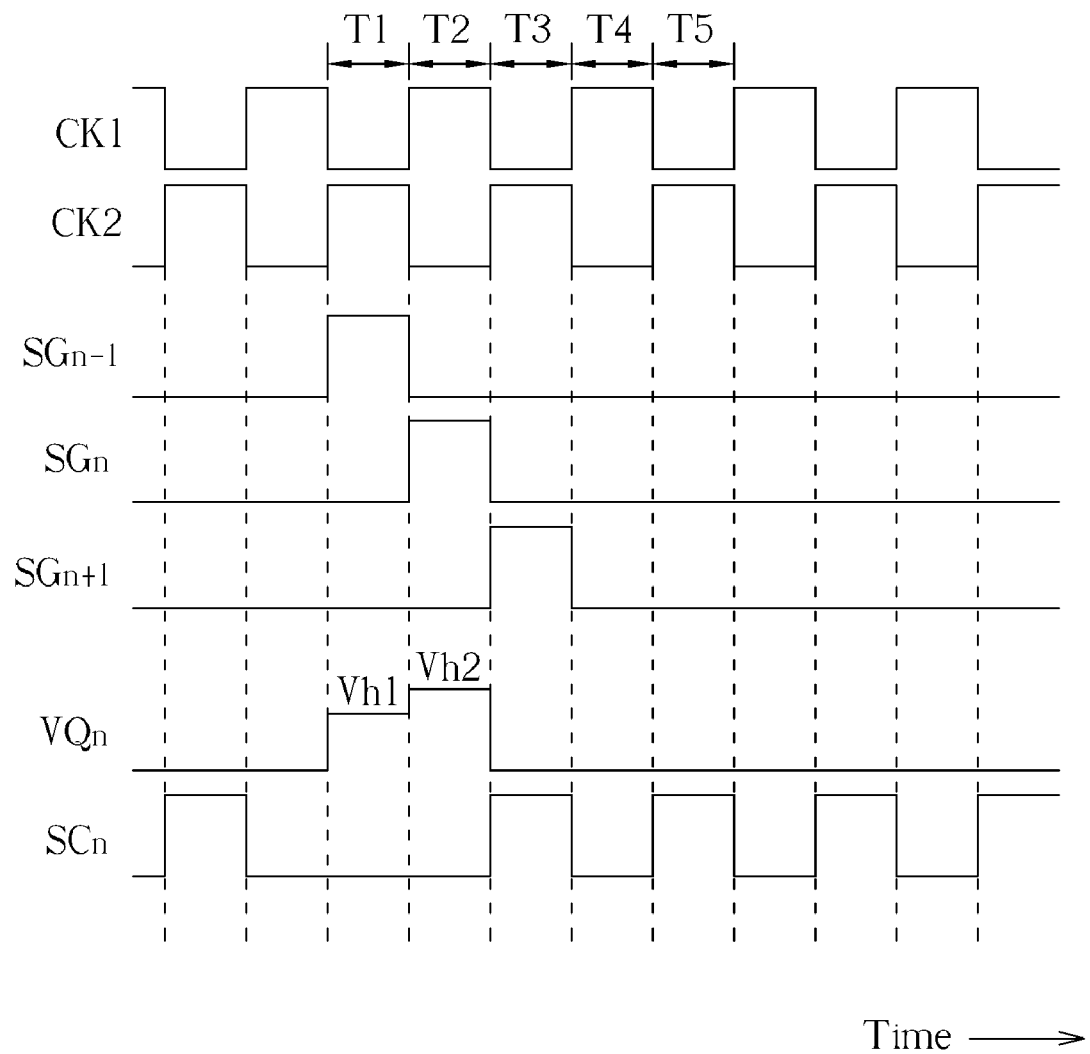
FIG. 3 is a schematic diagram showing related signal waveforms regarding the operation of the gate driving circuit in FIG. 2, having time along the abscissa.

FIG. 3 is a schematic diagram showing related signal waveforms regarding the operation of the gate driving circuit in FIG. 2, having time along the abscissa. The signal waveforms in FIG. 3, from top to bottom, are the first clock CK1, the second clock CK2, the gate signal SGn−1, the gate signal SGn, the gate signal SGn+1, the driving control voltage VQn, and the control signal SCn.

As shown in FIG. 3, during an interval T1, the gate signal SGn−1 is shifting from low voltage level to high voltage level, the buffer transistor 242 is then turned on for charging the capacitor 236 so as to boost the driving control voltage VQn to a first high voltage Vh1. Furthermore, the sixth switch 262 is also turned on by the gate signal SGn−1 for pulling down the control signal SCn to the low power voltage Vss. During an interval T2, the gate signal SGn−1 is falling down from high voltage level to low voltage level, the buffer transistor 242 is then turned off and the driving control voltage VQn becomes a floating voltage. In the meantime, along with the switching of the first clock CK1 to high voltage level, the driving control voltage VQn is further boosted from the first high voltage Vh1 to a second high voltage Vh2 due to a capacitive coupling effect caused by the device capacitor of the first switch 221. Accordingly, the first switch 221 is turned on for pulling up the gate signal SGn form low voltage level to high voltage level. Concurrently, the first clock CK1 is also employed to turn on the seventh switch 271 for switching the control signal SCn to the low power voltage Vss, and therefore the second switch 251 is turned off for actually floating the gate terminal of the first switch 221.

During an interval T3, the second clock CK2 is switching to high voltage level so that the fifth switch 261 is turned on for pulling up the control signal SCn to the high power voltage Vdd; furthermore, the second switch 251 is turned on for pulling down the driving control voltage VQn to the low power voltage Vss, and the third switch 256 is turned on for pulling down the gate signal SGn to the low power voltage Vss. Besides, by making use of the gate signal SGn as a start pulse signal, the (N+1)th shift register stage 213 is enabled to generate the gate signal SGn+1 having high voltage level during the interval T3, and therefore the fourth switch 266 is also turned on for pulling down the gate signal SGn to the low power voltage Vss.

During an interval T4, the second clock CK2 is switching to low voltage level and turns off the fifth switch 261. In the meantime, the first switch CK1 is switching to high voltage level, and therefore the seventh switch 271 is turned on for switching the control signal SCn to the low power voltage Vss; accordingly, both the second switch 251 and the third switch 256 are turned off. During an interval T5, the first clock CK1 is switching to low voltage level and turns off the seventh switch 271. Concurrently, the second clock CK2 is switching to high voltage level and turns on the fifth switch 261 for pulling up the control signal SCn to the high power voltage Vdd; therefore, the second switch 251 is turned on for pulling down the driving control voltage VQn to the low power voltage Vss, and the third switch 256 is turned on for pulling down the gate signal SGn to the low power voltage Vss.

Thereafter, as long as the gate signal SGn continues holding low voltage level, the aforementioned circuit operations, during the intervals T4 and T5, are repeated periodically so that the driving control voltage VQn and the gate signal SGn can be maintained at low voltage level. That is, the fifth switch 261 and the seventh switch 271 are alternatively turned on for shuttling the control signal SCn between the high power voltage Vdd and the low power voltage Vss. Accordingly, by means of alternatively turning on the fifth switch 261 and the seventh switch 271, the threshold voltage drift regarding the second switch 251 and the third switch 256 can be lessened significantly for enhancing the reliability and life-time of the gate driving circuit 200.

Figure 4:
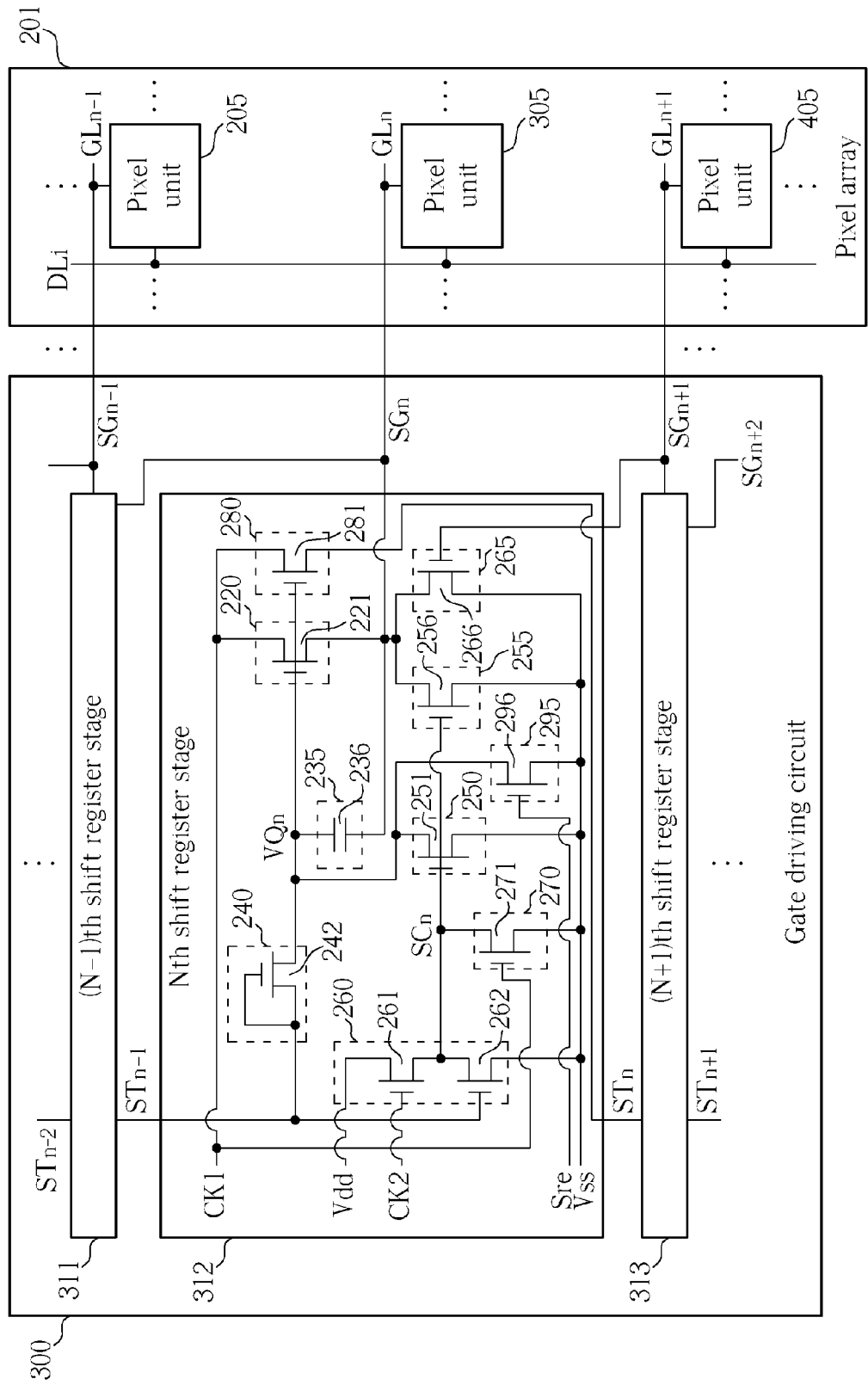
FIG. 4 is a schematic diagram showing a gate driving circuit in accordance with a second embodiment of the present invention.

FIG. 4 is a schematic diagram showing a gate driving circuit in accordance with a second embodiment of the present invention. As shown in FIG. 4, the gate driving circuit 300 comprises a plurality of shift register stages and, for ease of explanation, the gate driving circuit 300 still illustrates only a (N−1)th shift register stage 311, an Nth shift register stage 312, and a (N+1)th shift register stage 313. Compared with the gate driving circuit 200 shown in FIG. 2, the (N−1)th shift register stage 311 further provides a start pulse signal STn−1, the Nth shift register stage 312 further provides a start pulse signal STn, and the (N+1)th shift register stage 313 further provides a start pulse signal STn+1. The waveform of the start pulse signal STn−1 is substantially identical to that of the gate signal SGn−1, the waveform of the start pulse signal STn is substantially identical to that of the gate signal SGn, and the waveform of the start pulse signal STn+1 is substantially identical to that of the gate signal SGn+1.

Compared with the Nth shift register stage 212 shown in FIG. 2, the Nth shift register stage 312 further comprises a carry unit 280 and a reset unit 295. The carry unit 280 comprises an eighth switch 281 for generating the start pulse signal STn based on the driving control voltage VQn and the first clock CK1. The start pulse signal STn is forwarded to the (N+1)th shift register stage 313. The eighth switch 281 comprises a first terminal for receiving the first clock CK1, a gate terminal electrically connected to the first terminal of the capacitor 236, and a second terminal for outputting the start pulse signal STn to the (N+1)th shift register stage 313. The reset unit 295 comprises a ninth switch 296 for resetting the driving control voltage VQn to the low power voltage Vss according to a reset signal Sre. The ninth switch 296 comprises a first terminal electrically connected to the first terminal of the capacitor 236, a gate terminal for receiving the reset signal Sre, and a second terminal for receiving the low power voltage Vss. The eighth switch 281 and the ninth switch 296 are thin film transistors, MOS field effect transistors, or junction field effect transistors.

Besides, the first terminal of the buffer transistor 242 is electrically connected to the (N−1)th shift register stage 311 for receiving the start pulse signal STn−1. Other shift register stages, such as the (N−1)th shift register stage 311 and the (N+1)th shift register stage 313, can be inferred by analogy. Except for the abovementioned internal connecting relationships of each shift register stage in the gate driving circuit 300, other internal connecting relationships of each shift register stage in FIG. 4 are similar to those of the Nth shift register stage 212 in FIG. 2. The related signal waveforms regarding the operation of the gate driving circuit 300 are also identical to the signal waveforms shown in FIG. 3, and for the sake of brevity, further similar discussion thereof is omitted.

Figure 5:
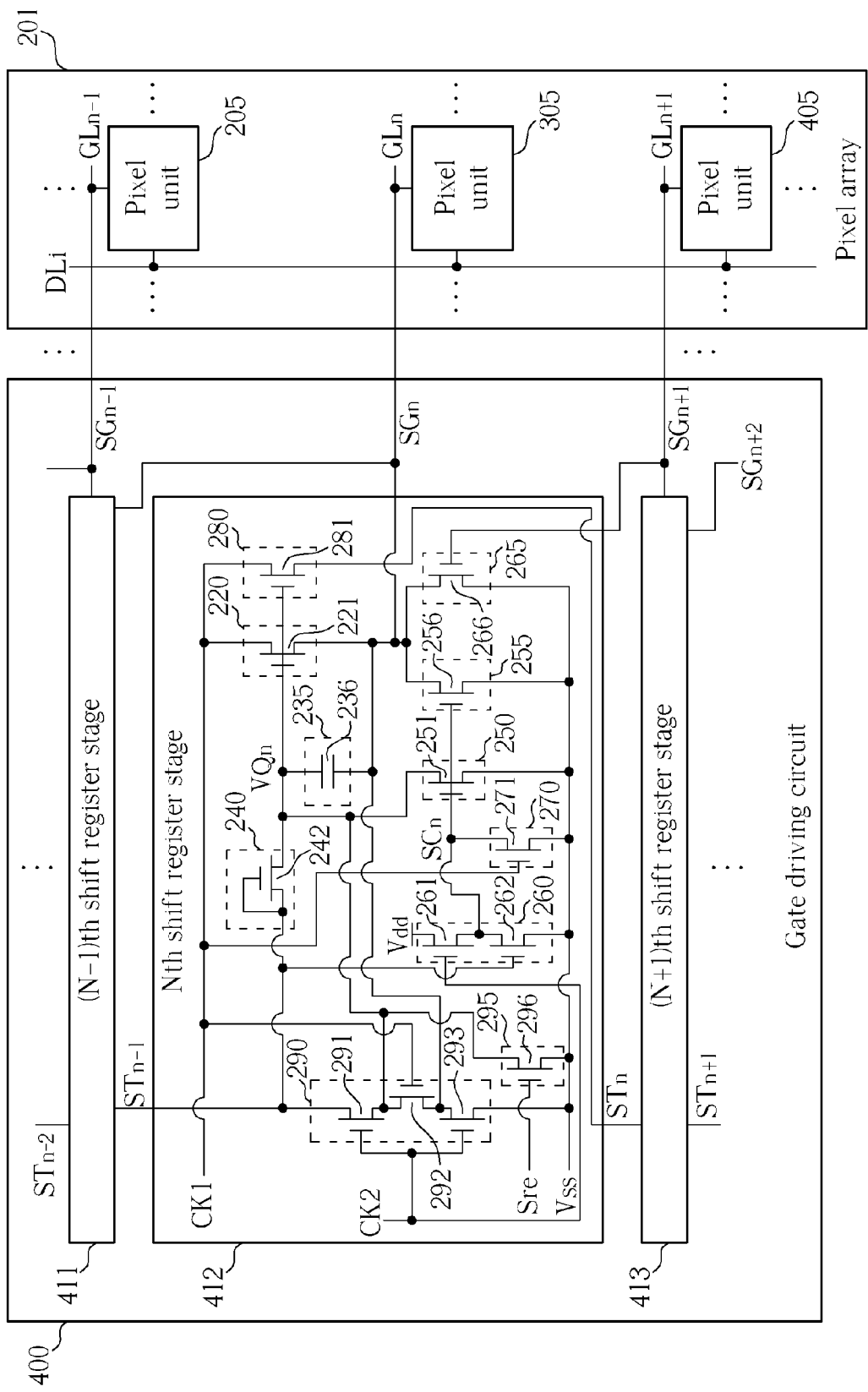
FIG. 5 is a schematic diagram showing a gate driving circuit in accordance with a third embodiment of the present invention.

FIG. 5 is a schematic diagram showing a gate driving circuit in accordance with a third embodiment of the present invention As shown in FIG. 5, the gate driving circuit 400 comprises a plurality of shift register stages and, for ease of explanation, the gate driving circuit 400 still illustrates only a (N−1)th shift register stage 411, an Nth shift register stage 412, and a (N+1)th shift register stage 413.

Compared with the Nth shift register stage 312 shown in FIG. 4, the Nth shift register stage 412 further comprises a voltage regulation unit 290. The voltage regulation unit 290 comprises a tenth switch 291, an eleventh switch 292, and a twelfth switch 293 for suppressing ripple voltage of the gate signal SGn. The tenth switch 291 comprises a first terminal for receiving the start pulse signal STn−1, a second terminal electrically connected to the second terminal of the buffer transistor 242, and a gate terminal for receiving the second clock CK2. The eleventh switch 292 comprises a first terminal electrically connected to the second terminal of the tenth switch 291, a second terminal electrically connected to the second terminal of the first switch 221, and a gate terminal for receiving the first clock CK1. The twelfth switch 293 comprises a first terminal electrically connected to the second terminal of the eleventh switch 292, a second terminal for receiving the low power voltage Vss, and a gate terminal for receiving the second clock CK2. The tenth switch 291, the eleventh switch 292 and the twelfth switch 293 are thin film transistors, MOS field effect transistors, or junction field effect transistors. The voltage regulation unit 290 is a well-known prior art, and for the sake of brevity, further discussion on related circuit operations thereof is omitted.

Other shift register stages, such as the (N−1)th shift register stage 411 and the (N+1)th shift register stage 413, can be inferred by analogy. Except for the abovementioned internal connecting relationships of each shift register stage in the gate driving circuit 400, other internal connecting relationships of each shift register stage in FIG. 5 are similar to those of the Nth shift register stage 312 in FIG. 4. The related signal waveforms regarding the operation of the gate driving circuit 400 are also identical to the signal waveforms shown in FIG. 3, and for the sake of brevity, further similar discussion thereof is omitted.

Figure 6:
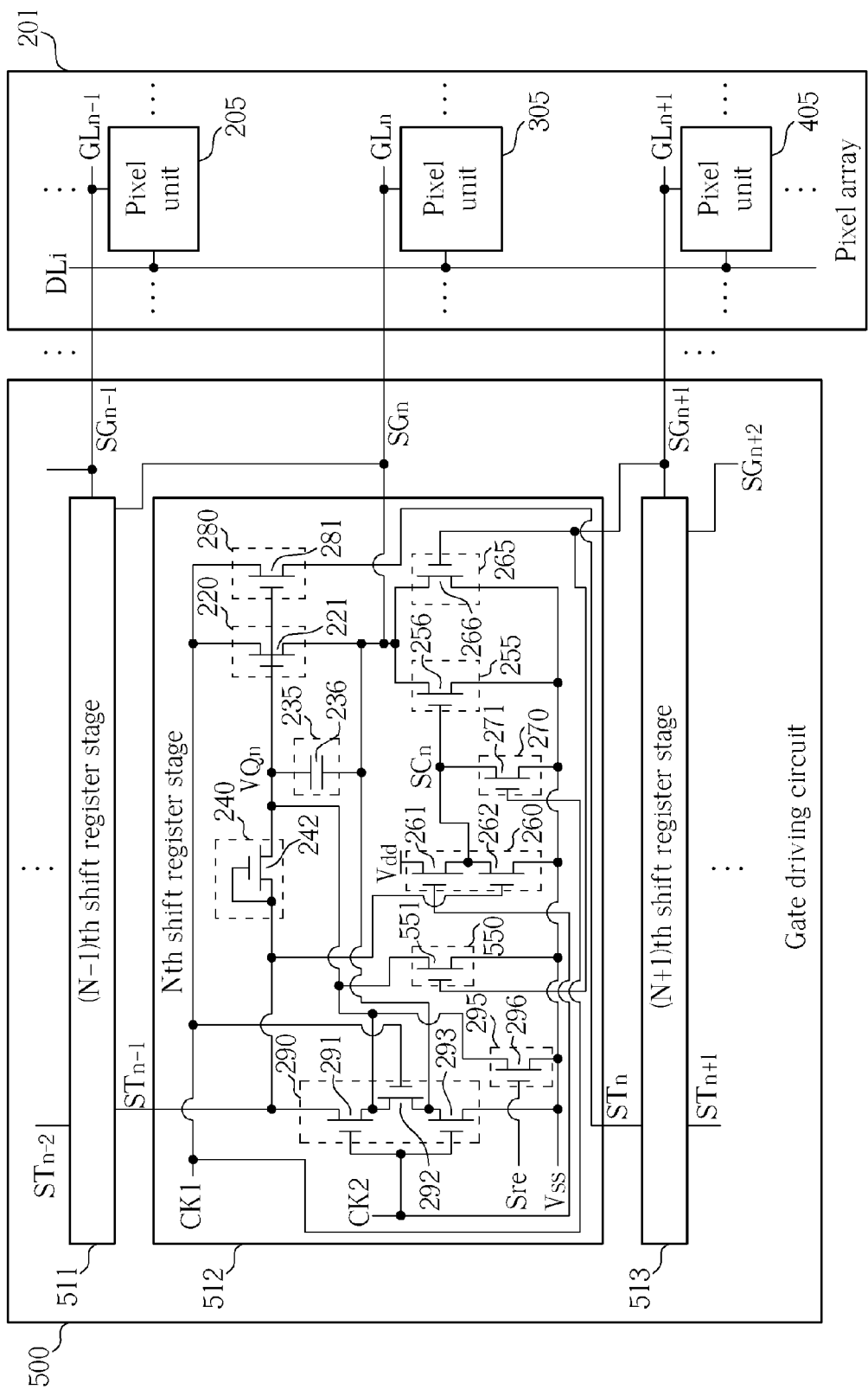
FIG. 6 is a schematic diagram showing a gate driving circuit in accordance with a fourth embodiment of the present invention.

FIG. 6 is a schematic diagram showing a gate driving circuit in accordance with a fourth embodiment of the present invention. As shown in FIG. 6, the gate driving circuit 500 comprises a plurality of shift register stages and, for ease of explanation, the gate driving circuit 500 still illustrates only a (N−1)th shift register stage 511, an Nth shift register stage 512, and a (N+1)th shift register stage 513. Also, only the internal structure of the Nth shift register stage 512 is exemplified. The other shift register stages are similar to the Nth shift register stage 512 and can be inferred by analogy.

The Nth shift register stage 512 is similar to the Nth shift register stage 412 shown in FIG. 5, differing only in that the discharging unit 250 is replaced with the discharging unit 550. The discharging unit 550 comprises a second switch 551 for pulling down the driving control voltage VQn to the low power voltage Vss by performing a discharging process based on the gate signal SGn+1. The second switch 551 comprises a first terminal electrically connected to the first terminal of the capacitor 236, a second terminal for receiving the low power voltage Vss, and a gate terminal electrically connected to the gate line GLn+1 for receiving the gate signal SGn+1.

Other shift register stages, such as the (N−1)th shift register stage 511 and the (N+1)th shift register stage 513, can be inferred by analogy. Except for the abovementioned internal connecting relationships of each shift register stage in the gate driving circuit 500, other internal connecting relationships of each shift register stage in FIG. 6 are similar to those of the Nth shift register stage 412 in FIG. 5. The related signal waveforms regarding the operation of the gate driving circuit 500 are also identical to the signal waveforms shown in FIG. 3, and for the sake of brevity, further similar discussion thereof is omitted.

Figure 7:
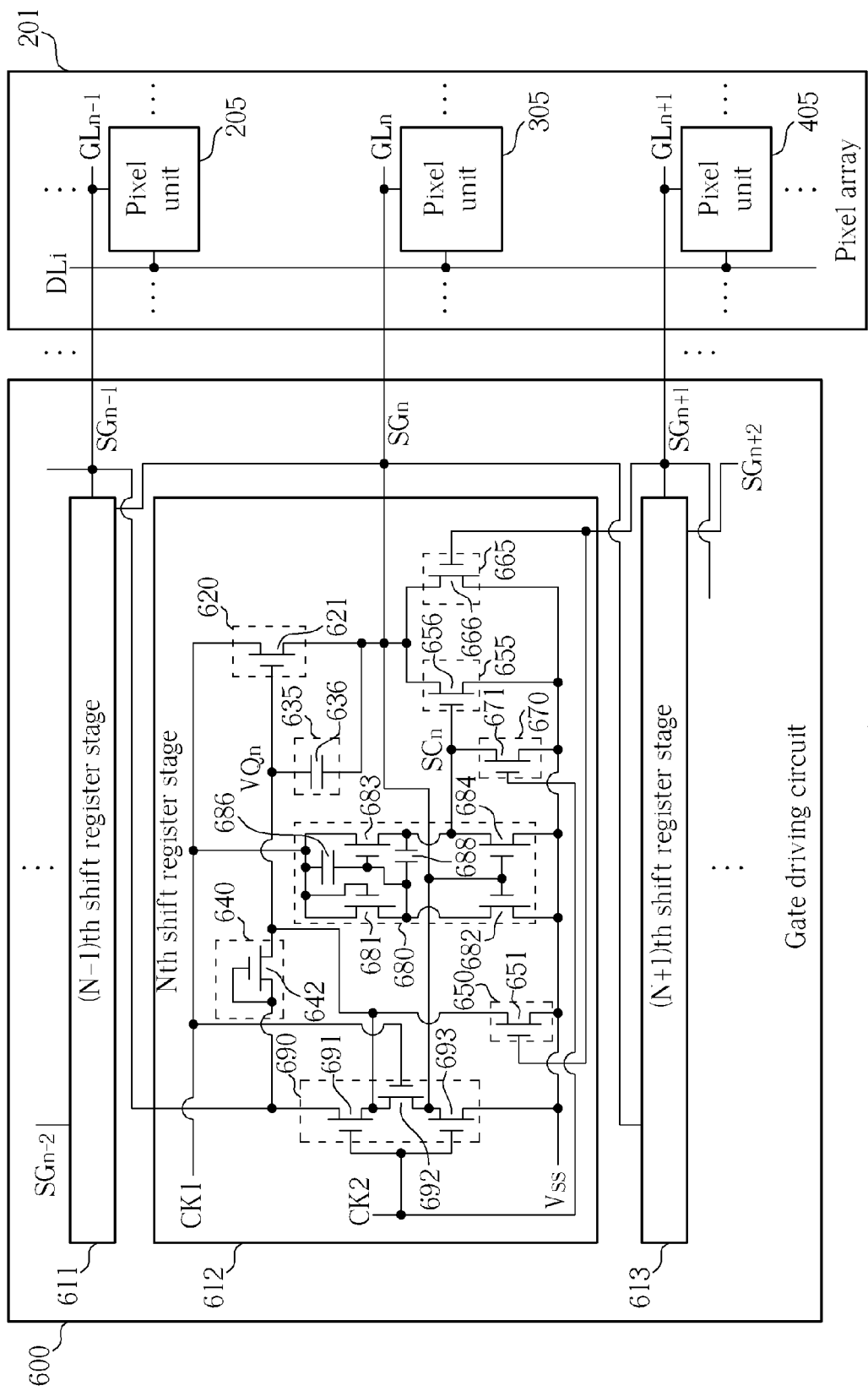
FIG. 7 is a schematic diagram showing a gate driving circuit in accordance with a fifth embodiment of the present invention.

FIG. 7 is a schematic diagram showing a gate driving circuit in accordance with a fifth embodiment of the present invention As shown in FIG. 7, the gate driving circuit 600 comprises a plurality of shift register stages and, for ease of explanation, the gate driving circuit 600 still illustrates only a (N−1)th shift register stage 611, an Nth shift register stage 612, and a (N+1)th shift register stage 613. Also, only the internal structure of the Nth shift register stage 612 is exemplified. The other shift register stages are similar to the Nth shift register stage 612 and can be inferred by analogy. The (N−1)th shift register stage 611 is employed to provide a gate signal SGn−1, the Nth shift register stage 612 is employed to provide a gate signal SGn, and the (N+1)th shift register stage 613 is employed to provide a gate signal SGn+1.

The Nth shift register stage 612 comprises a pull-up unit 620, an energy-store unit 635, a buffer unit 640, a discharging unit 650, a pull-down unit 655, a control unit 680, an auxiliary pull-down unit 665, a signal switching unit 670, and a voltage regulation unit 690. The pull-up unit 620 is electrically connected to the gate line GLn and functions to pull up the gate signal SGn of the gate line GLn based on the driving control voltage VQn and the first clock CK1. The buffer unit 640 is electrically connected to the (N−1)th shift register stage 611 for receiving the gate signal SGn−1. That is, the gate signal SGn−1 is also used as a start pulse signal for activating the Nth shift register stage 612. The energy-store unit 635 is electrically connected to the pull-up unit 620 and the buffer unit 640 and functions to provide the driving control voltage VQn to the pull-up unit 620 through performing a charging process based on the gate signal SGn−1. The control unit 680 is electrically connected to the pull-down unit 655 and functions to generate a control signal SCn based on the first clock CK1 and the gate signal SGn. The pull-down unit 655 is electrically connected to the gate line GLn for pulling down the gate signal SGn to the low power voltage Vss according to the control signal SCn. The auxiliary pull-down unit 665 is also electrically connected to the gate line GLn for pulling down the gate signal SGn to the low power voltage Vss according to the gate signal SGn+1. The signal switching unit 670 is electrically connected to the control unit 680 for switching the control signal SCn to the low power voltage Vss according to the second clock CK2. The discharging unit 650 is electrically connected to the energy-store unit 635 for pulling down the driving control voltage VQn to the low power voltage Vss by performing a discharging process based on the gate signal SGn+1. The voltage regulation unit 690 is electrically connected to the energy-store unit 635 and the gate line GLn for suppressing ripple voltage of the gate signal SGn.

In the embodiment shown in FIG. 7, the buffer unit 640 comprises a buffer transistor 642, the pull-up unit 620 comprises a first switch 621, the energy-store unit 635 comprises a capacitor 636, the discharging unit 650 comprises a second switch 651, the pull-down unit 655 comprises a third switch 656, the auxiliary pull-down unit 665 comprises a fourth switch 666, the signal switching unit 670 comprises a fifth switch 671, the voltage regulation unit 690 comprises a sixth switch 691, a seventh switch 692 and an eighth switch 693, and the control unit 680 comprises a ninth switch 681, a tenth switch 682, an eleventh switch 683, a twelfth switch 684, a first capacitor 686, and a second capacitor 688. The buffer transistor 642 and the first switch 621 through the twelfth switch 684 are thin film transistors, MOS field effect transistors, or junction field effect transistors.

The buffer transistor 642 comprises a first terminal electrically connected to the (N−1)th shift register stage 611 for receiving the gate signal SGn−1, a gate terminal electrically connected to the first terminal, and a second terminal electrically connected to the capacitor 636. The first switch 621 comprises a first terminal for receiving the first clock CK1, a gate terminal electrically connected to the second terminal of the buffer transistor 642, and a second terminal electrically connected to the gate line GLn. The capacitor 636 comprises a first terminal electrically connected to the gate terminal of the first switch 621 and a second terminal electrically connected to the second terminal of the first switch 621.

The second switch 651 comprises a first terminal electrically connected to the first terminal of the capacitor 636, a second terminal for receiving the low power voltage Vss, and a gate terminal electrically connected to the gate line GLn+1 for receiving the gate signal SGn+1. The third switch 656 comprises a first terminal electrically connected to the second terminal of the first switch 621, a second terminal for receiving the low power voltage Vss, and a gate terminal electrically connected to the control unit 680 for receiving the control signal SCn. The fourth switch 666 comprises a first terminal electrically connected to the second terminal of the first switch 621, a second terminal for receiving the low power voltage Vss, and a gate terminal electrically connected to the gate line GLn+1 for receiving the gate signal SGn+1. The fifth switch 671 comprises a first terminal electrically connected to the gate terminal of the third switch 656, a second terminal for receiving the low power voltage Vss, and a gate terminal for receiving the second clock CK2. The fifth switch 671 is utilized for switching the control signal SCn to the low power voltage Vss according to the second clock CK2.

The sixth switch 691 comprises a first terminal for receiving the gate signal SGn−1, a second terminal electrically connected to the second terminal of the buffer transistor 642, and a gate terminal for receiving the second clock CK2. The seventh switch 692 comprises a first terminal electrically connected to the second terminal of the sixth switch 691, a second terminal electrically connected to the second terminal of the first switch 621, and a gate terminal for receiving the first clock CK1. The eighth switch 693 comprises a first terminal electrically connected to the second terminal of the seventh switch 692, a second terminal for receiving the low power voltage Vss, and a gate terminal for receiving the second clock CK2.

The ninth switch 681 comprises a first terminal for receiving the first clock CK1, a gate terminal electrically connected to the first terminal, and a second terminal. The tenth switch 682 comprises a first terminal electrically connected to the second terminal of the ninth switch 681, a gate terminal for receiving the gate signal SGn, and a second terminal for receiving the low power voltage Vss. The eleventh switch 683 comprises a first terminal for receiving the first clock CK1, a gate terminal electrically connected to the second terminal of the ninth switch 681, and a second terminal electrically connected to the gate terminal of the third switch 656. The first capacitor 686 is electrically connected between the first and gate terminals of the eleventh switch 683. The second capacitor 688 is electrically connected between the gate and second terminals of the eleventh switch 683. The twelfth switch 684 comprises a first terminal electrically connected to the second terminal of the eleventh switch 683, a gate terminal electrically connected to the gate terminal of the tenth switch 682, and a second terminal for receiving the low power voltage Vss.

Figure 8:
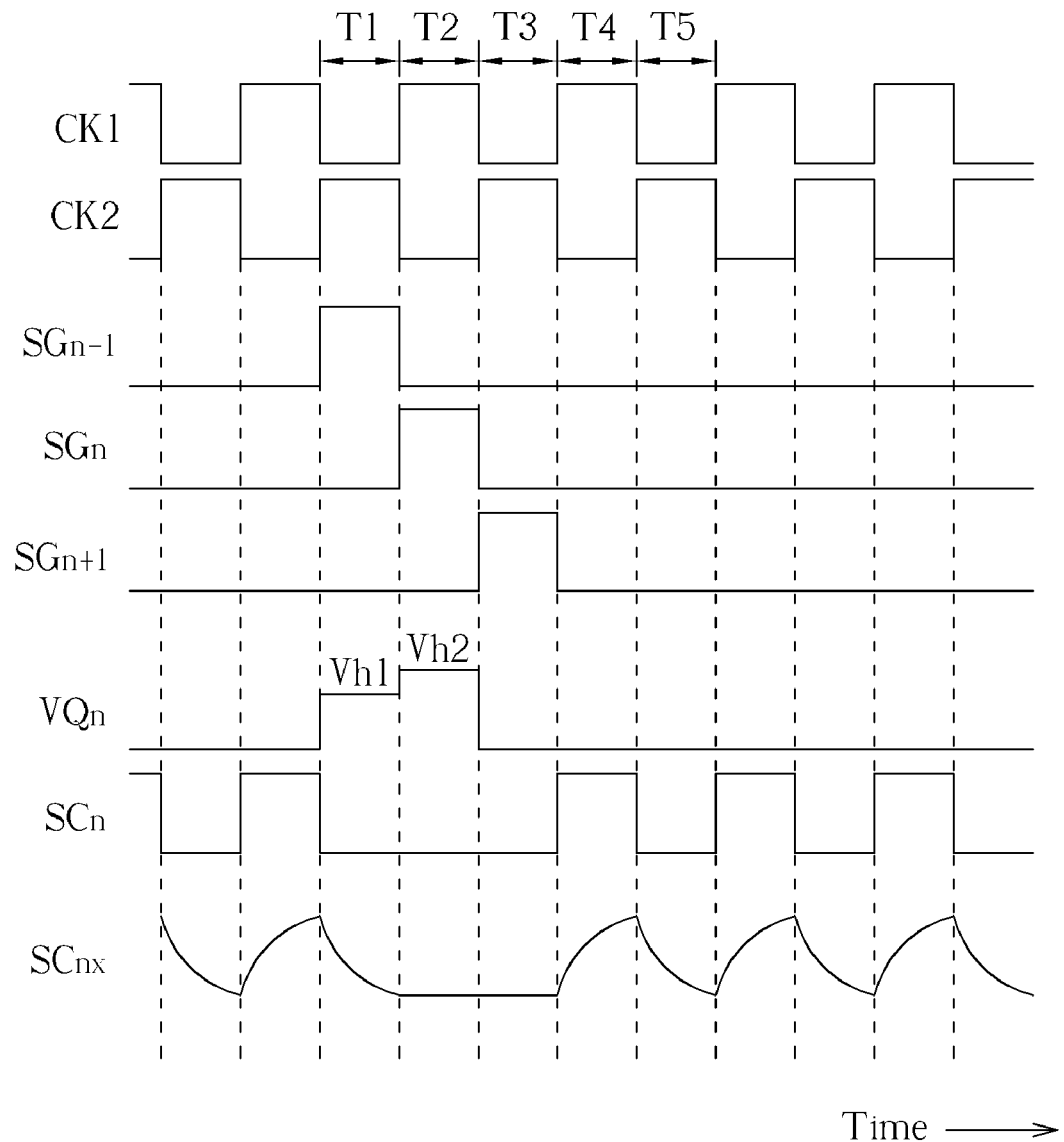
FIG. 8 is a schematic diagram showing related signal waveforms regarding the operation of the gate driving circuit in FIG. 7, having time along the abscissa.

FIG. 8 is a schematic diagram showing related signal waveforms regarding the operation of the gate driving circuit in FIG. 7, having time along the abscissa. The signal waveforms in FIG. 8, from top to bottom, are the first clock CK1, the second clock CK2, the gate signal SGn−1, the gate signal SGn, the gate signal SGn+1, the driving control voltage VQn, the control signal SCn, and control signal SCnx. As shown in FIG. 8, during an interval T1, the gate signal SGn−1 is shifting from low voltage level to high voltage level, the buffer transistor 642 is then turned on for charging the capacitor 236 so as to boost the driving control voltage VQn to a first high voltage Vh1. In the meantime, the fifth switch 671 is turned on by the second clock CK2 having high voltage level for switching the control signal SCn to the low power voltage Vss.

During an interval T2, the gate signal SGn−1 is falling down from high voltage level to low voltage level, the buffer transistor 642 is then turned off and the driving control voltage VQn becomes a floating voltage. Meanwhile, along with the switching of the first clock CK1 to high voltage level, the driving control voltage VQn is further boosted from the first high voltage Vh1 to a second high voltage Vh2 due to a capacitive coupling effect caused by the device capacitor of the first switch 621. Furthermore, the first switch 621 is turned on for pulling up the gate signal SGn form low voltage level to high voltage level. Concurrently, the twelfth switch 684 is turned on for switching the control signal SCn to the low power voltage Vss; also, the third switch 656 is turned off so that the gate signal SGn is able to hold high voltage level. During an interval T3, the second clock CK2 is switching to high voltage level for turning on the fifth transistor 671; and therefore, the control signal SCn retains the low power voltage Vss. Furthermore, by making use of the gate signal SGn as a start pulse signal, the (N+1)th shift register stage 613 is enabled to generate the gate signal SGn+1 having high voltage level. In view of that, the fourth switch 666 is turned on for pulling down the gate signal SGn to the low power voltage Vss.

During an interval T4, the second clock CK2 is switching to low voltage level, and therefore the fifth switch 671 is turned off. Concurrently, the first clock CK1 is switching to high voltage level for driving the control unit 680 to pull up the control signal SCn to high voltage level. Accordingly, the third switch 656 is turned on for pulling down the gate signal SGn to the low power voltage Vss. During an interval T5, the second clock CK2 is switching to high voltage level for turning on the fifth switch 671, and the control signal SCn is then pulled down to the low power voltage Vss for turning off the third switch 656. Thereafter, as long as the gate signal SGn continues holding low voltage level, the aforementioned circuit operations, during the intervals T4 and T5, are repeated periodically so that the gate signal SGn can be retained to low voltage level. That is, the fifth switch 671 is periodically turned on for periodically pulling down the control signal SCn to the low power voltage Vss. For that reason, the third switch 656 is periodically turned on for periodically pulling down the gate signal SGn to the low power voltage Vss, Please continue referring to FIG. 8, the waveform of the control signal SCnx is the output signal waveform of the control unit 680 corresponding to the circuit operation of the gate driving circuit 600 without the aid of the signal switching unit 670. As shown in FIG. 8, when the gate signal SGn is holding low voltage level, the waveform of the control signal SCnx is substantially a charging/discharging waveform instead of an ideal square waveform. In addition, if the capacitance ratio of the first capacitor 686 to the second capacitor 688 is not assigned properly, the waveform of the control signal SCnx is even worse. The charging/discharging waveform of the control signal SCnx will cause abnormal switching operations of the third switch 656, which is also likely to incur threshold voltage drift and degrades the circuit reliability and life-time. Compared with the control signal SCnx, the waveform of the control signal SCn is almost an ideal square waveform when the gate signal SGn is holding low voltage level, and therefore the third switch 656 is capable of performing normal switching operations. In other words, with the aid of the signal switching unit 670, the threshold voltage drift regarding the third switch 656 can be lessened significantly for enhancing the reliability and life-time of the gate driving circuit 600.

Figure 9:
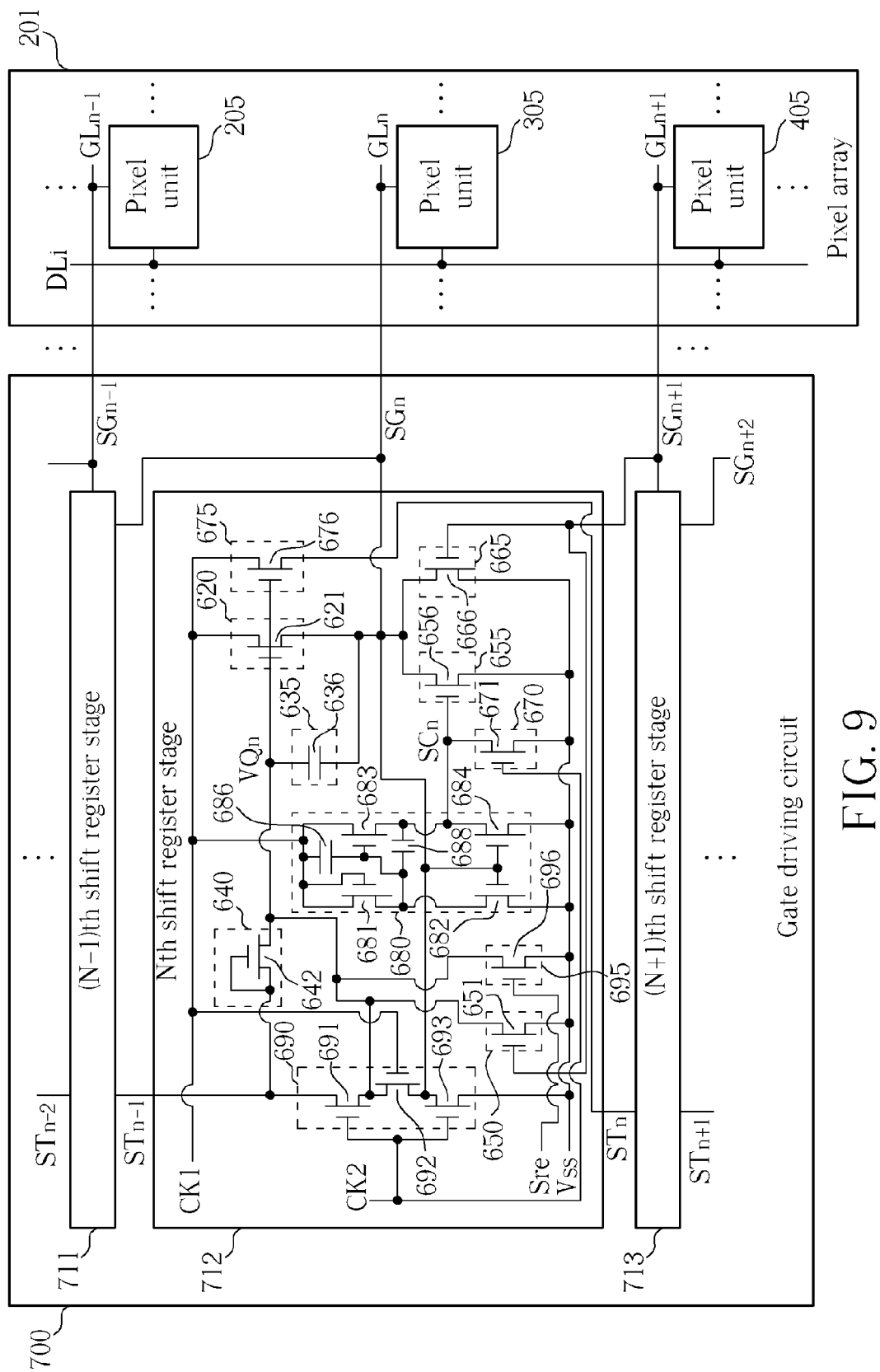
FIG. 9 is a schematic diagram showing a gate driving circuit in accordance with a sixth embodiment of the present invention.

FIG. 9 is a schematic diagram showing a gate driving circuit in accordance with a sixth embodiment of the present invention As shown in FIG. 9, the gate driving circuit 700 comprises a plurality of shift register stages and, for ease of explanation, the gate driving circuit 700 still illustrates only a (N−1)th shift register stage 711, an Nth shift register stage 712, and a (N+1)th shift register stage 713. Compared with the gate driving circuit 600 shown in FIG. 7, the (N−1)th shift register stage 711 further provides a start pulse signal STn−1, the Nth shift register stage 712 further provides a start pulse signal STn, and the (N+1)th shift register stage 713 further provides a start pulse signal STn+1. The waveform of each start pulse signal is substantially identical to that of one corresponding gate signal.

Compared with the Nth shift register stage 612 shown in FIG. 7, the Nth shift register stage 712 further comprises a carry unit 675 and a reset unit 695. The carry unit 675 comprises a thirteenth switch 676 for generating the start pulse signal STn based on the driving control voltage VQn and the first clock CK1. The start pulse signal STn is forwarded to the (N+1)th shift register stage 713. The thirteenth switch 676 comprises a first terminal for receiving the first clock CK1, a gate terminal electrically connected to the first terminal of the capacitor 636, and a second terminal for outputting the start pulse signal STn to the (N+1)th shift register stage 713. The reset unit 695 comprises a fourteenth switch 696 for resetting the driving control voltage VQn to the low power voltage Vss according to a reset signal Sre. The fourteenth switch 696 comprises a first terminal electrically connected to the first terminal of the capacitor 636, a gate terminal for receiving the reset signal Sre, and a second terminal for receiving the low power voltage Vss. The thirteenth switch 676 and the fourteenth switch 696 are thin film transistors, MOS field effect transistors, or junction field effect transistors.

Besides, the first terminals of the buffer transistor 642 and the sixth switch 691 are electrically connected to the (N−1)th shift register stage 711 for receiving the start pulse signal STn−1. Other shift register stages, such as the (N−1)th shift register stage 711 and the (N+1)th shift register stage 713, can be inferred by analogy. Except for the abovementioned internal connecting relationships of each shift register stage in the gate driving circuit 700, other internal connecting relationships of each shift register stage in FIG. 9 are similar to those of the Nth shift register stage 612 in FIG. 7. The related signal waveforms regarding the operation of the gate driving circuit 700 are also identical to the signal waveforms shown in FIG. 8, and for the sake of brevity, further similar discussion thereof is omitted.

In summary, by making use of an extra signal switching unit, the gate driving circuit of the present invention is capable of switching the control signal periodically between a high voltage level and a low voltage level, and therefore the threshold voltage drift regarding related transistors can be lessened significantly for enhancing the reliability and life-time of the gate driving circuit.

The present invention is by no means limited to the embodiments as described above by referring to the accompanying drawings, which may be modified and altered in a variety of different ways without departing from the scope of the present invention. Thus, it should be understood by those skilled in the art that various modifications, combinations, sub-combinations and alternations might occur depending on design requirements and other factors insofar as they are within the scope of the appended claims or the equivalents thereof.

What is claimed is:

1. A gate driving circuit for providing a plurality of gate signals to a plurality of gate lines, the gate driving circuit comprising a plurality of shift register stages, an Nth shift register stage of the shift register stages comprising:
   a pull-up unit, electrically connected to an Nth gate line of the gate lines, for pulling up an Nth gate signal of the gate signals to a high voltage level according to a driving control voltage and a first clock;
   a buffer unit for receiving an input signal;
   an energy-store unit, electrically connected to the pull-up unit and the buffer unit, for providing the driving control voltage to the pull-up unit through performing a charging process based on the input signal;
   a discharging unit, electrically connected to the energy-store unit, for pulling down the driving control voltage to a low power voltage according to a control signal or a (N+1)th gate signal generated by a (N+1)th shift register stage of the shift register stages;
   a pull-down unit, electrically connected to the Nth gate line, for pulling down the Nth gate signal to the low power voltage according to the control signal;
   a control unit, electrically connected to the discharging unit and the pull-down unit, for generating the control signal based on the input signal and a second clock having a phase opposite to the first clock; and
   a signal switching unit, electrically connected to the control unit, for switching the control signal to the low power voltage according to the first clock.

2. The gate driving circuit of claim 1, wherein the signal switching unit comprises a transistor, the transistor comprising:
   a first terminal electrically connected to the control unit;
   a gate terminal for receiving the first clock; and
   a second terminal for receiving the low power voltage.

3. The gate driving circuit of claim 1, wherein the pull-up unit comprises a transistor, the transistor comprising:
   a first terminal for receiving the first clock;
   a gate terminal electrically connected to the energy-store unit for receiving the driving control voltage; and a second terminal electrically connected to the Nth gate line.

4. The gate driving circuit of claim 1, wherein the energy-store unit comprises a capacitor.

5. The gate driving circuit of claim 1, wherein the buffer unit comprises a transistor, the transistor comprising:
   a first terminal electrically connected to a (N−1)th shift register stage for receiving a (N−1)th gate signal;
   a gate terminal electrically connected to the first terminal; and
   a second terminal electrically connected to the energy-store unit;
   wherein the input signal is the (N−1)th gate signal.

6. The gate driving circuit of claim 1, wherein the discharging unit comprises a transistor, the transistor comprising:
   a first terminal electrically connected to the energy-store unit;
   a gate terminal for receiving the (N+1)th gate signal; and
   a second terminal for receiving the low power voltage.

7. The gate driving circuit of claim 1, wherein the discharging unit comprises a transistor, the transistor comprising:
   a first terminal electrically connected to the energy-store unit;
   a gate terminal electrically connected to the control unit for receiving the control signal; and
   a second terminal for receiving the low power voltage.

8. The gate driving circuit of claim 1, wherein the pull-down unit comprises a transistor, the transistor comprising:
   a first terminal electrically connected to the Nth gate line;
   a gate terminal electrically connected to the control unit for receiving the control signal; and
   a second terminal for receiving the low power voltage.

9. The gate driving circuit of claim 1, wherein the control unit comprises:
   a first transistor comprising:
      a first terminal for receiving a high power voltage;
      a gate terminal for receiving the second clock; and
      a second terminal electrically connected to the discharging unit and the pull-down unit; and
   a second transistor comprising:
      a first terminal electrically connected to the second terminal of the first transistor;
      a gate terminal for receiving the input signal; and
      a second terminal for receiving the low power voltage.

10. The gate driving circuit of claim 1, wherein the Nth shift register stage further comprises:
    a carry unit, electrically connected to the energy-store unit, for generating an Nth start pulse signal according to the driving control voltage and the first clock, the Nth start pulse signal being forwarded to a buffer unit of the (N+1)th shift register stage.

11. The gate driving circuit of claim 10, wherein the carry unit of the Nth shift register stage comprises a transistor, the transistor comprising:
    a first terminal for receiving the first clock;
    a gate terminal electrically connected to the energy-store unit for receiving the driving control voltage; and
    a second terminal electrically connected to the buffer unit of the (N+1)th shift register stage.

12. The gate driving circuit of claim 11, wherein the buffer unit of the Nth shift register stage comprises a transistor, the transistor comprising:
    a first terminal for receiving a (N−1)th start pulse signal generated by a carry unit of a (N−1)th shift register stage;
    a gate terminal electrically connected to the first terminal; and
    a second terminal electrically connected to the energy-store unit;
    wherein the input signal is the (N−1)th start pulse signal.

13. The gate driving circuit of claim 1, wherein the Nth shift register stage further comprises:
    an auxiliary pull-down unit, electrically connected to the Nth gate line, for pulling down the Nth gate signal to the low power voltage based on the (N+1)th gate signal.

14. The gate driving circuit of claim 13, wherein the auxiliary pull-down unit comprises a transistor, the transistor comprising:
    a first terminal electrically connected to the Nth gate line;
    a gate terminal for receiving the (N+1)th gate signal; and
    a second terminal for receiving the low power voltage.

15. The gate driving circuit of claim 1, wherein the Nth shift register stage further comprises:
    a voltage regulation unit, electrically connected to the energy-store unit, for suppressing a ripple voltage of the Nth gate signal according to the input signal, the first clock, and the second clock.

16. The gate driving circuit of claim 15, wherein the voltage regulation unit comprises:
    a first transistor comprising:
       a first terminal for receiving the input signal;
       a gate terminal for receiving the second clock; and
       a second terminal electrically connected to the buffer unit;
    a second transistor comprising:
       a first terminal electrically connected to the second terminal of the first transistor;
       a gate terminal for receiving the first clock; and
       a second terminal electrically connected to the Nth gate line; and
    a third transistor comprising:
       a first terminal electrically connected to the second terminal of the second transistor;
       a gate terminal for receiving the second clock; and
       a second terminal for receiving the low power voltage.

17. The gate driving circuit of claim 1, wherein the Nth shift register stage further comprises:
    a reset unit, electrically connected to the energy-store unit, for resetting the driving control voltage to the low power voltage according to a reset signal.

18. The gate driving circuit of claim 17, wherein the reset unit of the Nth shift register stage comprises a transistor, the transistor comprising:
    a first terminal electrically connected to the energy-store unit;
    a gate terminal for receiving the reset signal; and
    a second terminal for receiving the low power voltage.

19. A gate driving circuit for providing a plurality of gate signals to a plurality of gate lines, the gate driving circuit comprising a plurality of shift register stages, an Nth shift register stage of the shift register stages comprising:
    a pull-up unit, electrically connected to an Nth gate line of the gate lines, for pulling up an Nth gate signal of the gate signals to a high voltage level according to a driving control voltage and a first clock;
    a buffer unit for receiving an input signal;
    an energy-store unit, electrically connected to the pull-up unit and the buffer unit, for providing the driving control voltage to the pull-up unit through performing a charging process based on the input signal;
    a discharging unit, electrically connected to the energy-store unit, for pulling down the driving control voltage to a low power voltage according to a (N+1)th gate signal generated by a (N+1)th shift register stage of the shift register stages;

a pull-down unit, electrically connected to the Nth gate line, for pulling down the Nth gate signal to the low power voltage according to a control signal;

a control unit, electrically connected to the pull-down unit, for generating the control signal based on the first clock and the Nth gate signal; and a signal switching unit, electrically connected to the control unit, for switching the control signal to the low power voltage according to a second clock having a phase opposite to the first clock.

20. The gate driving circuit of claim 19, wherein the signal switching unit comprises a transistor, the transistor comprising:

a first terminal electrically connected to the control unit;

a gate terminal for receiving the second clock; and a second terminal for receiving the low power voltage.

21. The gate driving circuit of claim 19 wherein the pull-up unit comprises a transistor, the transistor comprising:

a first terminal for receiving the first clock;

a gate terminal electrically connected to the energy-store unit for receiving the driving control voltage; and a second terminal electrically connected to the Nth gate line.

22. The gate driving circuit of claim 19, wherein the energy-store unit comprises a capacitor.

23. The gate driving circuit of claim 19, wherein the buffer unit comprises a transistor, the transistor comprising:

a first terminal electrically connected to a (N−1)th shift register stage for receiving a (N−1)th gate signal;

a gate terminal electrically connected to the first terminal; and a second terminal electrically connected to the energy-store unit;

wherein the input signal is the (N−1)th gate signal.

24. The gate driving circuit of claim 19, wherein the discharging unit comprises a transistor, the transistor comprising:

a first terminal electrically connected to the energy-store unit;

a gate terminal for receiving the (N+1)th gate signal; and a second terminal for receiving the low power voltage.

25. The gate driving circuit of claim 19, wherein the pull-down unit comprises a transistor, the transistor comprising:

a first terminal electrically connected to the Nth gate line;

a gate terminal electrically connected to the control unit for receiving the control signal; and a second terminal for receiving the low power voltage.

26. The gate driving circuit of claim 19, wherein the control unit comprises:

a first transistor comprising:

a first terminal for receiving the first clock;

a gate terminal electrically connected to the first terminal; and a second terminal;

a second transistor comprising:

a first terminal electrically connected to the second terminal of the first transistor;

a gate terminal electrically for receiving the Nth gate signal; and a second terminal for receiving the low power voltage;

a third transistor comprising:

a first terminal for receiving the first clock;

a gate terminal electrically connected to the second terminal of the first transistor; and a second terminal electrically connected to the pull-down unit;

a fourth transistor comprising:

a first terminal electrically connected to the second terminal of the third transistor;

a gate terminal electrically connected to the gate terminal of the second transistor; and a second terminal for receiving the low power voltage;

a first capacitor electrically connected between the first and gate terminals of the third transistor; and a second capacitor electrically connected between the gate and second terminals of the third transistor.

27. The gate driving circuit of claim 19, wherein the Nth shift register stage further comprises:

a carry unit, electrically connected to the energy-store unit, for generating an Nth start pulse signal according to the driving control voltage and the first clock, the Nth start pulse signal being forwarded to a buffer unit of the (N+1)th shift register stage.

28. The gate driving circuit of claim 27, wherein the carry unit of the Nth shift register stage comprises a transistor, the transistor comprising:

a first terminal for receiving the first clock;

a gate terminal electrically connected to the energy-store unit for receiving the driving control voltage; and a second terminal electrically connected to the buffer unit of the (N+1)th shift register stage.

29. The gate driving circuit of claim 28, wherein the buffer unit of the Nth shift register stage comprises a transistor, the transistor comprising:

a first terminal for receiving a (N−1)th start pulse signal generated by a carry unit of a (N−1)th shift register stage;

a gate terminal electrically connected to the first terminal; and a second terminal electrically connected to the energy-store unit;

wherein the input signal is the (N−1)th start pulse signal.

30. The gate driving circuit of claim 19, wherein the Nth shift register stage further comprises:

an auxiliary pull-down unit, electrically connected to the Nth gate line, for pulling down the Nth gate signal to the low power voltage based on the (N+1)th gate signal.

31. The gate driving circuit of claim 30, wherein the auxiliary pull-down unit comprises a transistor, the transistor comprising:

a first terminal electrically connected to the Nth gate line;

a gate terminal for receiving the (N+1)th gate signal; and a second terminal for receiving the low power voltage.

32. The gate driving circuit of claim 19, wherein the Nth shift register stage further comprises:

a voltage regulation unit, electrically connected to the energy-store unit, for suppressing a ripple voltage of the Nth gate signal according to the input signal, the first clock, and the second clock.

33. The gate driving circuit of claim 32, wherein the voltage regulation unit comprises:

a first transistor comprising:

a first terminal for receiving the input signal;

a gate terminal for receiving the second clock; and a second terminal electrically connected to the buffer unit;

a second transistor comprising:
- a first terminal electrically connected to the second terminal of the first transistor;
- a gate terminal for receiving the first clock; and
- a second terminal electrically connected to the Nth gate line; and a third transistor comprising:
- a first terminal electrically connected to the second terminal of the second transistor;
- a gate terminal for receiving the second clock; and
- a second terminal for receiving the low power voltage.

34. The gate driving circuit of claim 19, wherein the Nth shift register stage further comprises:

- a reset unit, electrically connected to the energy-store unit, for resetting the driving control voltage to the low power voltage according to a reset signal.

35. The gate driving circuit of claim 34, wherein the reset unit of the Nth shift register stage comprises a transistor, the transistor comprising:
- a first terminal electrically connected to the energy-store unit;
- a gate terminal for receiving the reset signal; and
- a second terminal for receiving the low power voltage.

* * * * *